(12) United States Patent
Wang et al.

(10) Patent No.: US 12,031,885 B2
(45) Date of Patent: Jul. 9, 2024

(54) LEAK DETECTION FOR GAS STICKS

(71) Applicant: Applied Materials, Inc., Santa Clara, CA (US)

(72) Inventors: Yen-Kun Wang, Santa Clara, CA (US); Alex J. Tom, San Francisco, CA (US); Ming Xu, San Jose, CA (US); Ashley Okada, San Jose, CA (US); Kenneth Le, Freemont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/190,418

(22) Filed: Mar. 27, 2023

(65) Prior Publication Data

US 2023/0314269 A1    Oct. 5, 2023

Related U.S. Application Data

(60) Provisional application No. 63/326,166, filed on Mar. 31, 2022.

(51) Int. Cl.
*G01M 3/28*      (2006.01)
*H01L 21/67*      (2006.01)

(52) U.S. Cl.
CPC ..... *G01M 3/2815* (2013.01); *H01L 21/67253* (2013.01)

(58) Field of Classification Search
CPC .. G01M 3/00; G01M 3/26–28; G01M 3/2815; H01L 21/67; H01L 21/67253
See application file for complete search history.

(56) References Cited

U.S. PATENT DOCUMENTS

| | | | | |
|---|---|---|---|---|
| 6,227,035 | B1* | 5/2001 | Rice | G01M 3/2876 73/37.9 |
| 11,703,414 | B2* | 7/2023 | Obrist | G01M 3/2815 73/40.5 R |
| 2007/0181192 | A1 | 8/2007 | Kook et al. | |
| 2011/0108128 | A1 | 5/2011 | Mahon et al. | |
| 2017/0322568 | A1 | 11/2017 | Katsushi et al. | |
| 2018/0180509 | A1 | 6/2018 | Sawachi et al. | |
| 2022/0283051 | A1* | 9/2022 | Weiler | G01M 3/2807 |

FOREIGN PATENT DOCUMENTS

| | | | |
|---|---|---|---|
| JP | 2007095728 A | 4/2007 | |
| KR | 100745372 B1 | 8/2007 | |
| WO | WO-2022135854 A1 * | 6/2022 | ............ G01M 3/202 |

OTHER PUBLICATIONS

International Search Report and Written Opinion for PCTUS2023/016972 dated Jul. 24, 2023, 10 pages.

* cited by examiner

*Primary Examiner* — Nguyen Q. Ha
(74) *Attorney, Agent, or Firm* — Lowenstein Sandler LLP (57) ABSTRACT

A method and system for monitoring and detecting a gas leak in a gas stick assembly is provided. The method includes measuring a pressure in a mass flow controller of the gas stick assembly at different time points and determining whether there is a difference in pressure at the different time points that exceeds a difference threshold.

18 Claims, 7 Drawing Sheets

LEAK DETECTION FOR GAS STICKS

CROSS REFERENCE TO RELATED APPLICATION(S)

The present application claims priority to U.S. Provisional Patent Application No. 63/326,166 filed on Mar. 31, 2022, the entire contents of which are incorporated in its entirety.

TECHNICAL FIELD

The present disclosure relates, in general, to a method and hardware for monitoring gas leaks. In particular, the present disclosure relates to a method and hardware for rapid in-situ detection of gas leaks during processing and/or between processing of semiconductor substrates.

BACKGROUND

Semiconductor substrates are commonly processed in processing systems. These systems include one or more processing chambers, each performing substrate processing operations such as etching, chemical vapor deposition, or physical vapor deposition, which can include temperature and pressure cycling as well as introduction of a variety of chemical components into the chambers. Some processing chambers also include a gas panel to perform the substrate processing operations. The processing chambers undergo regular maintenance and the health of such processing chambers is regularly monitored.

The gas panels in the processing chambers are subject to transporting a variety of gases throughout the processing chamber. These gases include both toxic and non-toxic gases. It is not uncommon for gas leaks to occur in the gas panel (e.g., in gas stick assemblies), which causes problems in the gas panel. When there is a gas leak in the gas panel, the gas panel most likely needs to be repaired or replaced, slowing down production of semiconductor substrates. Alternatively, if hydrobromide is the gas that leaks in the gas panel, it can react with moisture in the atmosphere inside the gas panel forming hydrobromic acid, which may then attack materials of the gas panel (e.g., such as stainless steel).

Currently, there are no in-situ methods to detect such a leak in the gas panel. Instead, once a gas panel is installed the typical inspection process to check if a gas leak is occurring in a gas stick or gas panel is through visual inspection of the gas panel. During the visual inspection, a user checks to see if there is any corrosion in the gas panel or on the gas stick. Such inspection techniques do not catch gas leaks until the leaks have been ongoing and/or have become excessive.

SUMMARY

Some embodiments described herein are directed to a method for detecting a gas leak in a gas panel and/or gas stick assembly (also referred to simply as a gas stick) of a processing chamber.

In some embodiments of the present disclosure, a method for monitoring a gas leak in a gas stick assembly is provided. The method may include closing a first valve of the gas stick assembly that is downstream of a mass flow controller (MFC) or pressure sensor in a flow path of the gas stick assembly; opening one or more additional valves of the gas stick assembly that are upstream of the MFC or pressure sensor for a first time period until the gas stick assembly is pressurized by a gas; closing a second valve of the one or more valves, wherein at least a portion of the gas stick assembly between the first valve and the second valve is pressurized after closing the second valve; measuring pressure within at least the portion of the gas stick assembly by a pressure sensor of the MFC or other pressure sensor in a flow path to gather pressure data over a second time period; and analyzing the pressure data to determine whether at least the portion of the gas stick assembly has a leak.

In some embodiments of the present disclosure, a method for monitoring a gas leak in a gas stick assembly is provided. In this method, the method may include closing a first valve of the gas stick assembly that is upstream of a mass flow controller (MFC) or other pressure sensor in the flow path of the gas stick assembly; opening a second valve of one or more valves of the gas stick assembly that is downstream of the MFC or other pressure sensor; connecting an output end of the gas stick assembly to a pump; pumping the gas stick assembly down to a first pressure, closing the second valve of the one or more valves of the gas stick assembly, wherein at least a portion of the gas stick assembly between the first valve and the second valve is under vacuum after closing the second valve; measuring pressure within at least the portion of the gas stick assembly by a pressure sensor of the MFC or other pressure sensor in a flow path to gather pressure data over a second time period; and analyzing the pressure data to determine whether at least the portion of the gas stick assembly has a leak.

In some embodiments of the present disclosure, a system is provided. The system includes a memory and a processing device operatively coupled to the memory. The processing device causes a first valve of a gas stick assembly that is a first one of downstream or upstream of a mass flow controller (MFC) or other pressure sensor of the gas stick assembly to close. The processing device further causes one or more additional valves of the gas stick assembly to remain open for a first time period until the gas stick assembly reaches a target pressure. The processing device further causes a second valve of the one or more additional valves to close once the gas stick assembly reaches the target pressure, wherein at least a portion of the gas stick between the first valve and the second valve has the target pressure after closing the second valve. The processing device further receives pressure data for a pressure within at least the portion of the gas stick assembly from a pressure sensor of the MFC or other pressure sensor over a second time period. The processing device analyzes the pressure data to determine whether at least the portion of the gas stick assembly has a leak.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Described herein is a method and a system for monitoring/detecting a gas leak in the gas panel and/or gas stick assembly of a manufacturing chamber (also referred to as a process chamber). In certain embodiments, the present disclosure is directed to methods suitable to quickly detect a gas leak in a gas stick assembly of a gas panel.

The methods and systems of the present disclosure give active, in-situ, real time feedback during the manufacturing process and/or between runs of the manufacturing process, which can be used to quickly (e.g., within minutes) determine whether a gas stick assembly in the gas panel has a leak. The methods and systems described herein reduce system maintenance time by providing early detection of a gas leak. Such early detection of a gas leak may prevent unnecessary early maintenance or replacement of a part and/or may trigger maintenance of a part. The methods and systems described herein are more cost effective than traditional techniques and systems for detecting gas leaks, making them more viable and likely to be utilized on a large number of chambers.

The term "in-situ" herein means "in place" in the sense that the processing chamber remains intact and the processing chamber need not be disassembled or exposed to atmosphere in order to carry out the disclosed method(s). In-situ method(s) may be performed between processing of substrates or even as a step in a process performed in a process chamber (e.g., a step in an etch process, a deposition process, etc.).

In certain embodiments, described herein is a system that includes a manufacturing chamber (e.g., semiconductor processing chamber). The manufacturing chamber may include one or more inputs that permit gases to flow into the chamber and/or one or more outputs that permit gases to flow out of the chamber. In embodiments, one or more gas stick assemblies may be connected to the manufacturing chamber, each of which may deliver a different gas to the manufacturing chamber. The system may include a controller or processing device that automatically implements the gas leak techniques described herein.

The methods of the present disclosure are advantageous over prior methods of leak detection on processing chambers, gas panels and/or gas stick assemblies because the processing chamber in embodiments does not need to be shut down to perform leak detection. In fact, in embodiments the method for detecting/monitoring a gas leak can be performed during the ideal time between running processes on the processing chamber (e.g., to deposit and/or etch a layer on a substrate) without having to pump out the gas inside the gas stick and/or without upsetting a vacuum environment within the processing chamber. Another advantage to this method in embodiments, is that each gas stick assembly can be checked simultaneously or in parallel. If there is a leak detected in any one or more of the gas stick assemblies, the leak on the specific gas stick assembly or assemblies can be identified by the system. In contrast, conventional leak detection techniques cannot identify which gas stick assembly in a gas panel is leaking.

Aspects of the present disclosure result in technological advantages compared to conventional solutions. The present disclosure results in a more efficient substrate manufacturing process, wherein gas leaks may be prevented and/or detected early. If a gas leak is detected in a manufacturing chamber, wasted material, exposure to toxic/non-toxic gas, wear of the manufacturing chamber components, and so on may be prevented. A gas leak may also be detected and may indicate an aging component. Thus, by detecting the gas leak earlier than can conventionally be achieved, unscheduled down time can be reduced, costs associated with express shipping replacement parts can be avoided, and the like.

Figure 1:
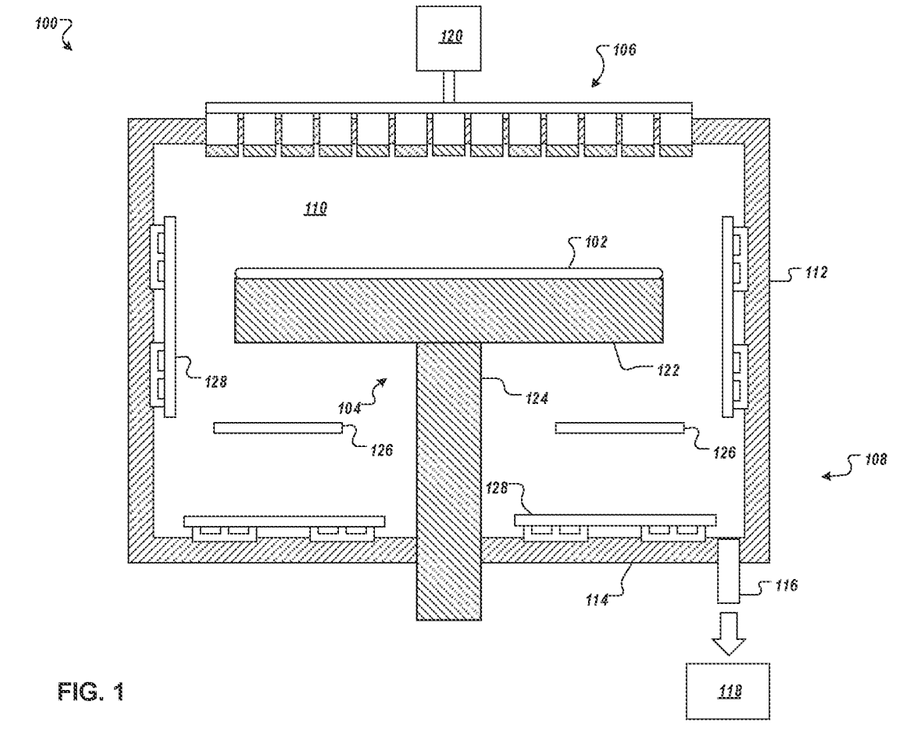
FIG. 1 depicts a sectional view of a manufacturing chamber according to certain embodiments.

FIG. 1 depicts a sectional view of a manufacturing chamber 100 (e.g., a semiconductor processing chamber) according to some aspects of this disclosure. Manufacturing chamber 100 may be one or more of an etch chamber (e.g., a plasma etch chamber), deposition chamber (including atomic layer deposition, chemical vapor deposition, physical vapor deposition, or plasma enhanced versions thereof), anneal chamber, or the like. For example, manufacturing chamber 100 may be a chamber for a plasma etcher, a plasma cleaner, atomic layer deposition (ALD) device, chemical vapor deposition (CVD) device, and so forth. Examples of chamber components may include a substrate support assembly 104, an electrostatic chuck, a ring (e.g., a process kit ring), a chamber wall, a base, a showerhead 106, a gas distribution plate, a liner, a liner kit, a shield, a plasma screen, a flow equalizer, a cooling base, a chamber viewport, a chamber lid, a nozzle and so on.

In one embodiment, manufacturing chamber 100 may include a chamber body 108 and a showerhead 106 that enclose an interior volume 110. In some chambers, showerhead 106, may be replaced by a lid and a nozzle. Chamber body 108 may be constructed from aluminum, stainless steel, or other suitable material. Chamber body 108 generally includes sidewalls 112 and a bottom 114.

An exhaust port 116 may be defined in chamber body 108, and may couple interior volume 110 to a pump system 118. Pump system 118 may include one or more pumps and valves utilized to evacuate and regulate the pressure of interior volume 110 of manufacturing chamber 100. An actuator to control gas flow out of the chamber and/or pressure in the chamber may be disposed at or near exhaust port 116.

Showerhead 106 may be supported on sidewalls 112 of chamber body 508 or on a top portion of the chamber body. Showerhead 106 (or the lid, in some embodiments) may be opened to allow access to interior volume 110 of manufacturing chamber 100, and may provide a seal for manufacturing chamber 100 while closed.

Gas panel 120 may be coupled to manufacturing chamber 100 to provide process or cleaning gases to interior volume 110 through showerhead 106 (or lid and nozzle). The gas panel 120 may be coupled to the manufacturing chamber 100 to provide process and/or cleaning gases via one or more supply line to the interior volume 110 through showerhead 106. The gas panel 120 may include or be connected to one or more flow control apparatus. The flow control apparatus (es) may be used to measure and control the flow of one or more gasses from one or more gas sources to interior volume 110. In one embodiment, the gas panel 120 includes multiple gas stick assemblies, as detailed below with reference to FIGS. 2-3B. Each gas stick assembly may include one or more valves, filters, mass flow controllers (MFCs) and/or other components, as set forth below.

Showerhead 106 may include multiple gas delivery holes throughout. Examples of processing gases that may be used to process substrates in manufacturing chamber 100 may include toxic gases, non-toxic gases, or a combination thereof. For example, the processing gases may include halogen-containing gases, such as $C_2F_6$, $SF_6$, $SiCl_4$, HBr, $NF_3$, $CF_4$, $CHF_3$, $F_2$, $Cl_2$, $CCl_4$, $BCl_3$, and $SiF_4$, among others, and other gases such as $O_2$ or $N_2O$. Examples of carrier gases include $N_2$, He, Ar and other gases inert to process gases (e.g., non-reactive gases).

Substrate support assembly 104 may be disposed in interior volume 110 of manufacturing chamber 100 below showerhead 106. In some embodiments, substrate support assembly 104 includes a susceptor 122 and shaft 124. Substrate support assembly 104 supports a substrate during processing. In some embodiments, also disposed within manufacturing chamber 100 are one or more heaters 126 and reflectors 128.

In some embodiments, showerhead 106 is configured to produce plasma via RF discharge. Maximum power delivery depends on matching impedance between the RF source and the plasma. Impedance matching may be performed by a closed loop control system. Sensors measuring properties related to the RF impedance matching (RF match) may be monitored. Impedance within manufacturing chamber 100 is highly correlated with chamber pressure. Monitoring properties related to RF impedance matching (e.g., RF match voltage, RF match current, RF match capacitor position) may provide insight into the pressure inside the manufacturing chamber.

Figure 2:
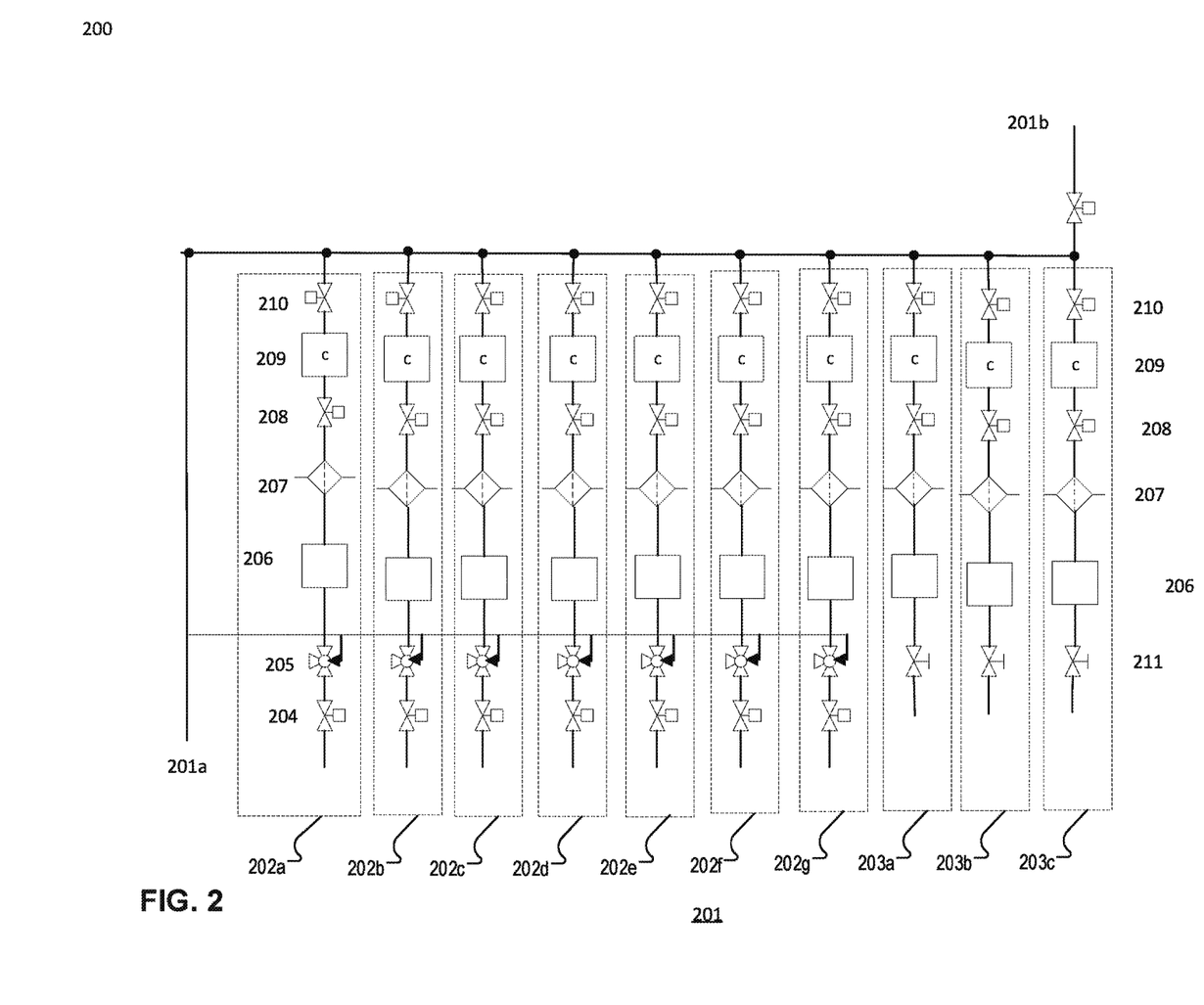
FIG. 2 illustrates a schematic of a gas panel of the manufacturing chamber according to an embodiment of the present disclosure.

FIG. 2 is a schematic of a gas panel 200 that may be used in the manufacturing chamber of FIG. 1. As described above, the gas panel provides process and/or cleaning gases to the showerhead and/or to other components of a processing chamber. To effectively provide a process or cleaning gas, a gas stick assembly may be utilized.

The gas stick assembly of the present disclosure may be used with a toxic gas (e.g., as with gas stick assemblies 202a-g) or may be used with an inert or non-toxic gas (e.g., as with gas stick assemblies 203a-c). Each gas stick assembly 202a-g, 203a-c may be used to flow a different gas into the processing chamber in embodiments. To provide gas flow through the gas panel 200, a gas enters the panel through one end of the panel 201a. For example, if a cleaning gas is used, it may enter the gas stick assembly where it flows through the appropriate gas stick assembly 202a-g, 203a-c and then flows into the processing chamber through an output end 201b. A purge gas may enter through the gas panel 200 through an input end 201a, in which it travels to the appropriate gas stick assembly 202a-g. The purge gas may be $N_2$ and may enter the gas stick assembly 202a-g through a purge valve 205 to remove any toxic gas before servicing the system.

The gas panel may include a single gas stick assembly 202a-g, multiple gas stick assemblies 202a-g, a single inert gas stick assembly 203a-c, and/or multiple inert gas stick assemblies 203a-c. For example, FIG. 2 depicts seven (7) gas stick assemblies 202a-g and three (3) inert gas stick assemblies 203a-c. However, this is not meant to limit the amount or type of gas stick assemblies that may be included in the gas panel 200. In some embodiments, the gas panel 200 may include 1, 2, 3, 4, 5, 6, 7, 8, 9, 10, 11, 12, 13, 14, 15, 16, 17, 18, 19, or 20 gas stick assemblies 202a-g and 1, 2, 3, 4, 5, 6, 7, 8, 9, 10, 11, 12, 13, 14, 15, 16, 17, 18, 19, or 20 inert gas stick assemblies 203a-c. Further, the components of each gas stick assembly 202a-g and inert gas stick assembly 203a-c of FIG. 2 are not labeled herein for clarity, but it is to be understood that each gas stick assembly 202a-g and inert gas stick assembly 203a-c may include the same or different components to those described herein for some gas stick assemblies. The gas stick assembly 202a-g in embodiments may include a hybrid valve 204, a purge valve 205, a regulator 206, a filter or purifier 207, an upstream valve 208, a mass flow controller 209 and a downstream valve 210. The hybrid valve 204 may allow for the gas to flow through the gas stick assembly if in an open position, or may keep gas from flowing into in the gas stick assembly if in a closed position. The hybrid valve 204 may include a combination of a manual valve and a valve that can be automatically actuated (e.g., a pneumatic valve, electrical valve, etc.). The purge valve 205 may be used to purge out toxic gas before working on the toxic gas stick assembly. The regulator 206 may be a pressure regulator which may control the pressure within the gas stick assembly 200. The filter or purifier 207 may reduce any contaminants from entering. The upstream valve 208 may be in an open or closed position to allow gas to either leave or remain in the mass flow controller 209, depending on the process. The mass flow controller 209 may include a pressure sensor, which provides pressure data of the gas stick assembly. The downstream valve 210 may be in an open or closed position to allow gas to either leave or remain in the mass flow controller 209, depending on the process. The inert gas stick assembly 203a-c in embodiments may include a manual valve 211, a regulator 206, a filter or purifier 207, an upstream valve 208, a mass flow controller 209 and a downstream valve 210.

Figure 3A:
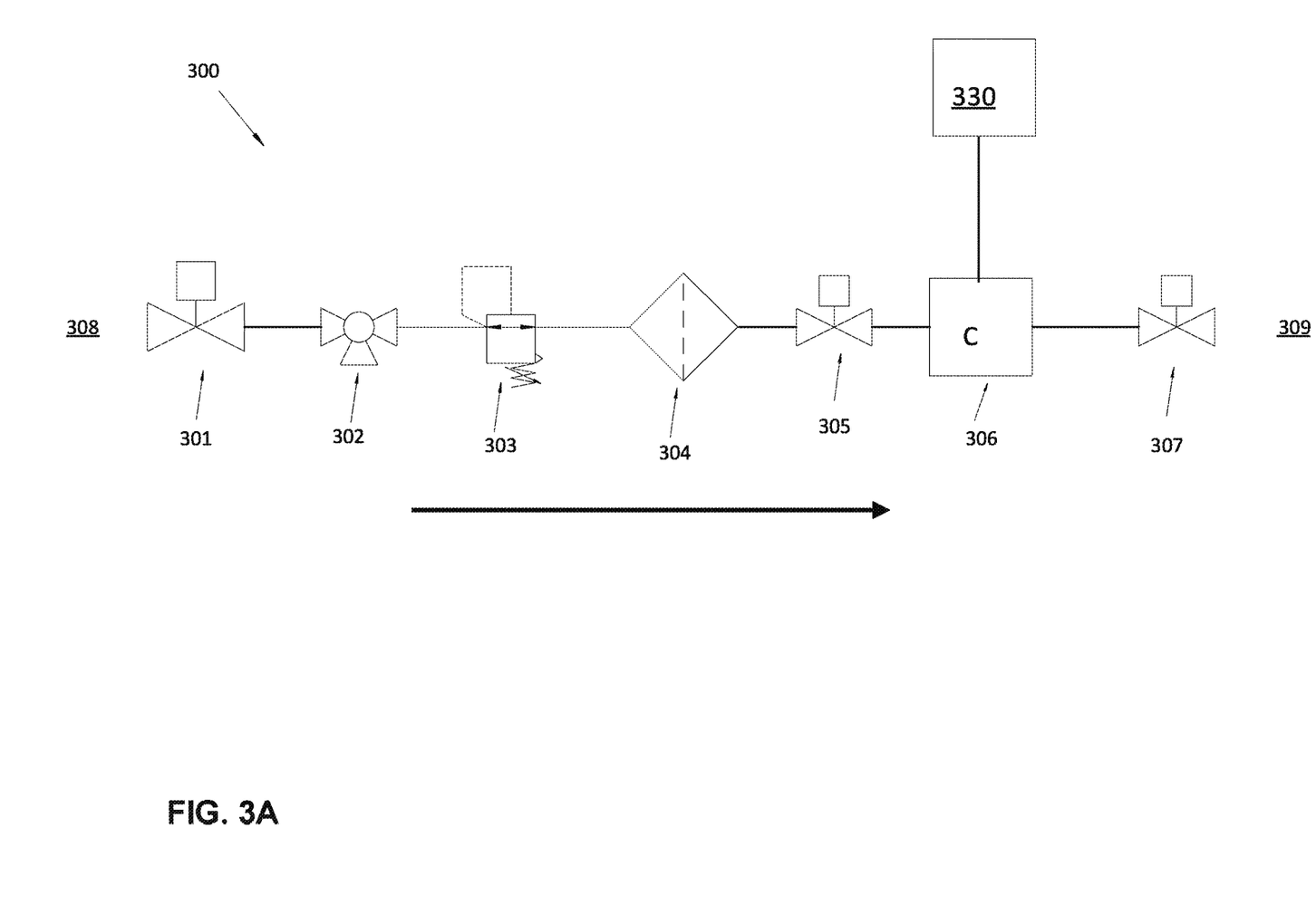
FIG. 3A illustrates a schematic of a gas stick assembly for use in the gas panel according to an embodiment of the present disclosure.
Figure 3B:
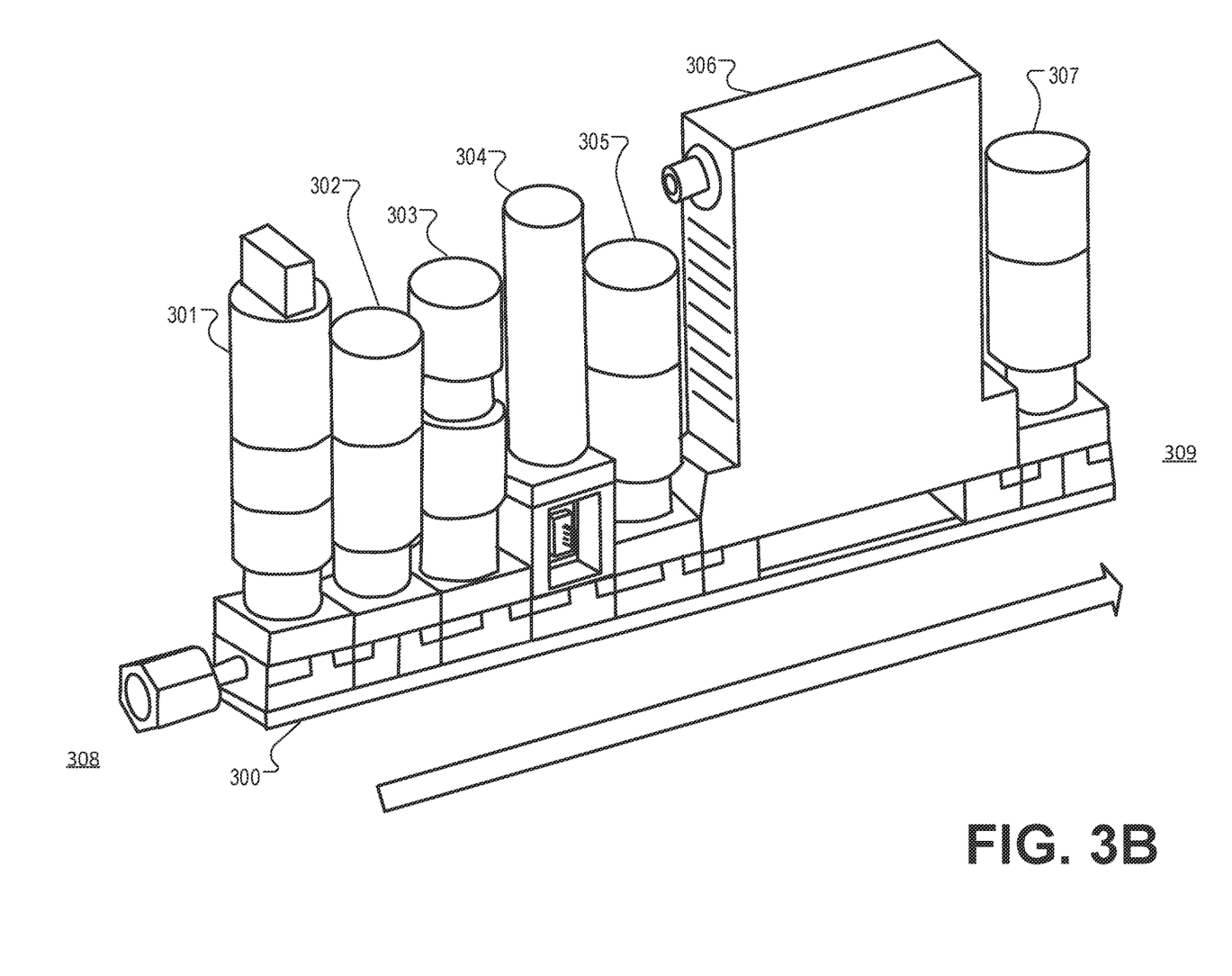
FIG. 3B illustrates a gas stick assembly for use in the gas panel according to an embodiment of the present disclosure.

FIGS. 3A-B illustrate a gas stick assembly 300 according to an embodiment of the present disclosure. The gas stick assembly 300 is illustrative of the gas stick assembly 202a-g of FIG. 2. That is, gas stick assembly 300 represents a gas stick assembly that is used to flow toxic gases. For a gas stick assembly in which non-toxic gases flow, a purge valve 302 may not be present. As can be seen in FIG. 3, the gas stick assembly 300 includes an input end 308 and an output end 309. A gas may flow through the gas stick assembly 300 from the input end 308 to the output end 309 as indicated by the arrow in FIG. 3. The gas that flows through the gas stick assembly may be a gas as described in relation to the gas stick assemblies of FIG. 2. The gas stick assembly 300 may include a hybrid valve 301 that is upstream of a mass flow controller 306. A hybrid valve may include a combination of a manual valve and a valve that can be automatically actuated (e.g., a pneumatic valve, electrical valve, etc.).

If a toxic gas is to travel through the gas stick assembly, a purge valve 302 may be included, which may be used to purge out toxic gas before working on the toxic gas stick assembly. Next, a regulator 303 is included in the gas stick assembly 300. The regulator 303 may be a pressure regulator as known in the art. A filter 304 is also included upstream of the mass flow controller 306 in the gas stick assembly 300 to filter any contaminants from the gas. An isolation valve 305 is included upstream of the mass flow controller 306, and an isolation valve 307 is downstream of the mass flow controller 306 in the gas stick assembly 300. The isolation valve 307 is on the output end 309 of the gas stick assembly 300. The mass flow controller 306 of the present disclosure includes a pressure sensor, a controller (e.g., a processing device) and/or a variable or proportional valve that can control an amount of gas that flows through the mass flow controller based on instructions from the controller of the MFC. The MFC 306 is an instrument used to measure and control the flow of gasses. The MFC 306 may be designed and calibrated for a specific type of gas in embodiments. The MFC 306 of the gas stick assembly 300 may be connected to a computing device, processing device or additional controller 330 (e.g., a controller for a processing device, for a tool cluster, etc.). The MFC 306 may generate pressure measurements and send the pressure measurements to the controller 330.

Controller 330 may process the data from the MFC 306 to perform a leak check of the gas stick assembly 300. In embodiments, controller 330 may additionally be connected to one or more valves (e.g., hybrid valve 301, valve 302, valve 305 and/or valve 307) of the gas stick assembly 300. All such connections between the controller 330 and one or more components of the gas stick assembly 300 may be wired connections or wireless connections (e.g., connections via Wi-Fi, Bluetooth, Zigbee, or another wireless protocol). Through such connections, the controller 330 can cause one or more operations to be performed on the gas stick assembly 300 to effectuate a leak test as set forth in embodiments herein. Accordingly, the controller 330 can measure and monitor the pressure of the mass flow controller 306, either in a pressurized or vacuum system, as described in relation to the flow charts of FIGS. 4 and 5.

In an alternative embodiment, a pressure gauge (not pictured) may be included in the gas stick assembly 300. The pressure gauge may be included in addition to or instead of the MFC 306 within the gas stick assembly. If a pressure gauge is included in the gas stick assembly, it may be included downstream of the regulator 303 and upstream of filter 304. Further, if a pressure gauge is included, then the MFC may not include an internal pressure sensor. In some embodiments, the pressure gauge may be connected to a computing device, processing device or additional controller 330 (e.g., a controller for a processing device, for a tool cluster, etc.). The pressure gauge may generate pressure measurements and send the pressure measurements to the controller 330 as described in relation to the MFC 306. The pressure gauge and pressure sensor of the MFC may be in a flow path of the gas in the gas stick assembly 300.

Embodiments are discussed herein with reference to an MFC that includes an internal pressure sensor. It should be understood that embodiments discussed with reference to use of an MFC to measure pressure within a gas stick assembly may instead use other pressure sensors that are not part of an MFC.

In some embodiments, the controller 330 includes a central processing unit (CPU), microcontroller, a programmable logic controller (PLC), a system on a chip (SoC), a server computer, or other suitable type of computing device. The controller 330 may be configured to execute programming instructions related to one or more gas leak checks as described herein. The controller 330 may receive feedback signals from the MFC 306 and may compute a pressure within at least a portion of the gas stick assembly multiple times during the gas leak check. In some embodiments, the controller 330 is configured to execute a gas leak check recipe, or one or more steps of a gas leak check recipe. Such a gas leak check recipe may be performed in-situ in a gas stick assembly before, after, or during execution of a process recipe on product. For example, a gas leak check may be performed as a step in a process recipe performed on product.

The portion of the gas stick assembly for which a leak check is performed may depend on which valves are actuated. For example, a region between valves 305 and 307 may be checked for a leak, a region between valves 302 and 307 may be checked for a leak, and/or a region between valves 301 and 307 may be checked for a leak (effectively checking the entirety of the gas stick assembly for a leak). If a leak is discovered (e.g., by pressurizing or causing a vacuum) between valves 301 and 307, then further leak checks may be performed for the region between valve 302 and 307 and/or between valve 305 and 307 to narrow down a source of the leak. For example, a first leak check may be performed between valve 301 and valve 307. If a leak is discovered, then a further leak check may be performed for the region between valve 305 and valve 307. If the second leak check indicates a leak, then the leak would be from the region between valve 305 and 307, but if the second leak check does not indicate a leak, then the leak detected by the first leak check would be between valve 301 and valve 305.

Figure 4:
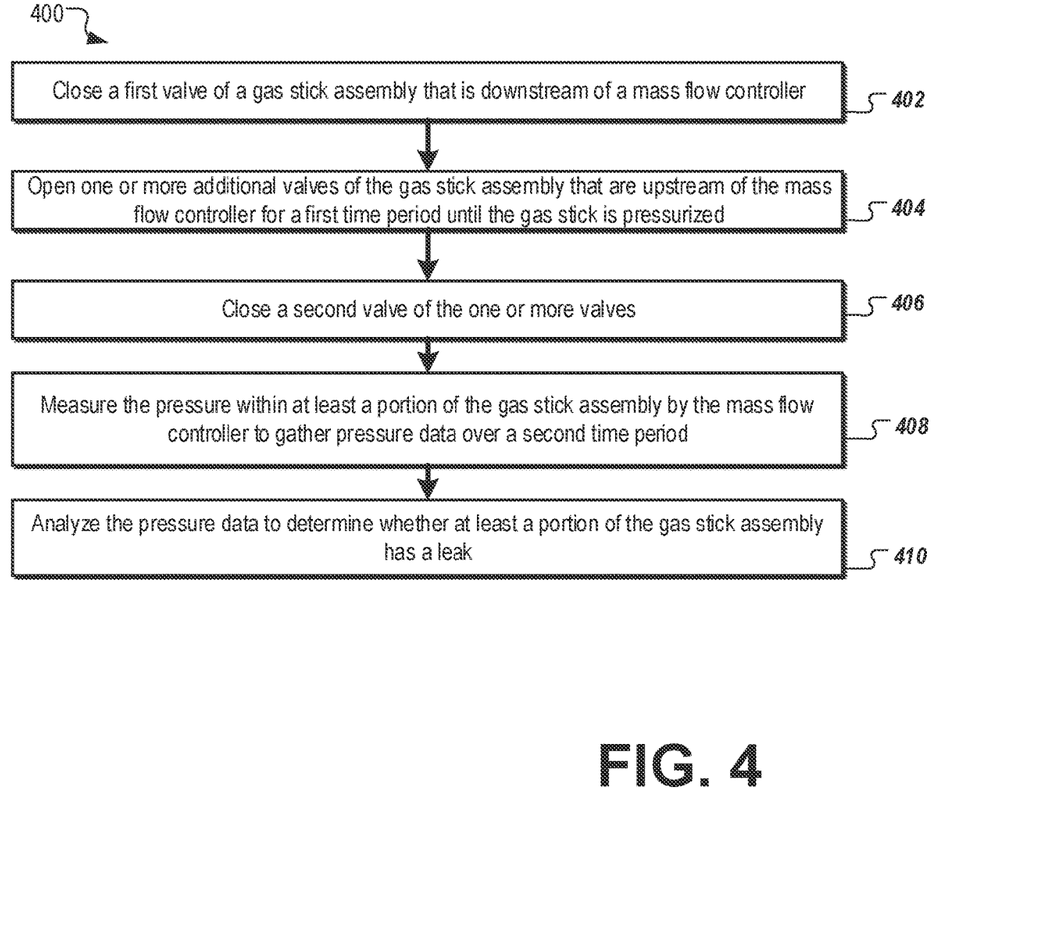
FIG. 4 illustrates a flow chart of method for detecting a gas leak according to an embodiment of the present disclosure.

FIG. 4 illustrates a flow chart of a method 400 for detecting a gas leak in a gas stick assembly according to an embodiment of the present disclosure. The gas stick assembly may include a first end comprising an input configured to receive a gas from a gas source, a second end comprising an output configured to deliver the gas to a destination (e.g., to a processing chamber), and a plurality of components between the first end and the second end, wherein the plurality of components include at least two valves and a mass flow controller (MFC). The method 400 of FIG. 4 describes monitoring and/or detecting a gas leak under pressurized conditions 400. FIG. 4 will be explained generally and an exemplary embodiment will be explained using the gas stick assembly of FIGS. 3A-B. The method of FIG. 4 may be performed in-situ in the processing chamber. In embodiments, operations of method 400 are performed by one or more components associated with a process chamber (e.g., by a controller for a process chamber) and/or by an external controller or processing device.

In block 402 of method 400, a first valve of the gas stick assembly that is downstream of a mass flow controller (MFC) is closed. For example, a controller may cause the valve to actuate to close the valve. This valve may be a final valve of the gas stick assembly. Then, in block 404, one or more additional valves that are upstream of the MFC are opened for a first time period until the gas stick assembly is pressurized. For example, the controller may cause the one or more additional valves to actuate to open. While the one or more additional valves are opened, a gas may be flowed into the gas stick assembly, building up a pressure within the gas stick assembly since the downstream valve is closed. For example, the controller may cause a gas source to flow the gas into the gas stick assembly. The pressure of the gas stick assembly may be about 30 psia to about 50 psia, or about 35 psia, about 40 psia, or about 45 psia, or any value therein. The first time period may be about 5 seconds to about 60 seconds, or about 10 seconds, about 15 seconds, about 20 seconds, about 25 seconds, about 30 seconds, about 35 seconds, about 40 seconds, about 45 seconds, about 50 seconds or about 60 seconds, or any value therein. Once the gas stick assembly is pressurized, a second valve of the one or more additional valves is closed in 406. For example, the controller may cause the second valve to actuate and close. In embodiments, the second valve is a first valve of the gas stick assembly (which is upstream of the MFC). One of more additional valves and/or other components may be attached to the gas stick assembly between the second valve and the MFC.

The pressure of at least a portion of the gas stick assembly is then measured using the pressure sensor in the MFC over a second time period in block 408. In embodiments, the MFC generates pressure measurements and sends the pressure measurements to the controller periodically or continuously over the second time period. The second time period may be about 5 seconds to about 60 seconds, or about 10 seconds, about 15 seconds, about 20 seconds, about 25 seconds, about 30 seconds, about 35 seconds, about 40 seconds, about 45 seconds, about 50 seconds or about 60 seconds, or any value therein. The pressure data is then analyzed by processing logic (e.g., by the controller) to determine whether the portion of the gas stick assembly has a leak in block 410. The pressure data may be analyzed using a processing device of the controller to compare the pressure data received over the time period.

In embodiments, processing logic determines whether there is a leak by comparing at least a second pressure generated later in the second time period (e.g., at an end of the second time period) to a first pressure generated earlier in the second time period (e.g., at a beginning of the second time period). Based on the comparison, processing logic determines whether there is a difference between the two (or more) pressure measurements (e.g., whether the second pressure is lower than the first pressure by at least a threshold amount). If there is a difference detected, then processing logic determines whether at least a portion of the gas stick assembly has a leak based on whether the detected pressure difference exceeds a pressure difference threshold. If the pressure difference exceeds the pressure difference threshold, then a leak is detected. If there is no pressure difference, or the pressure difference does not exceed the pressure difference threshold, then no leak is detected. In embodiments, the pressure difference threshold is about 5 psi to about 15 psi. Other pressure difference thresholds may also be used.

In some embodiments, pressure may be plotted over time from multiple pressure measurements to determine one or more properties of a leak, such as an extent of the leak. If a leak is detected, a signal may be sent to the system to alert a user. If there is a leak, a user can stop the processing chamber or divert the gas flow to an alternative gas stick assembly. If no leak is detected, the processing chamber can continue operating without a distribution.

As an example, the gas stick assembly of FIG. 3 may be monitored according to method 400 as follows. In a first step, the isolation valve 307 of the gas stick assembly 300 is closed. The hybrid valve 301, the purge valve 302, the isolation valve 305, or a combination thereof may be open until the gas stick assembly is pressurized as described above. Once pressurized, the hybrid valve 301, valve 302 or isolation valve 305 is closed. The pressure of the mass flow controller 306 is then measured for a time period and this pressure data is gathered in a processing device. The pressure data is then analyzed to determine whether the gas stick assembly (or a portion thereof) has a leak (e.g., whether a pressure drop is observed over time).

Figure 5:
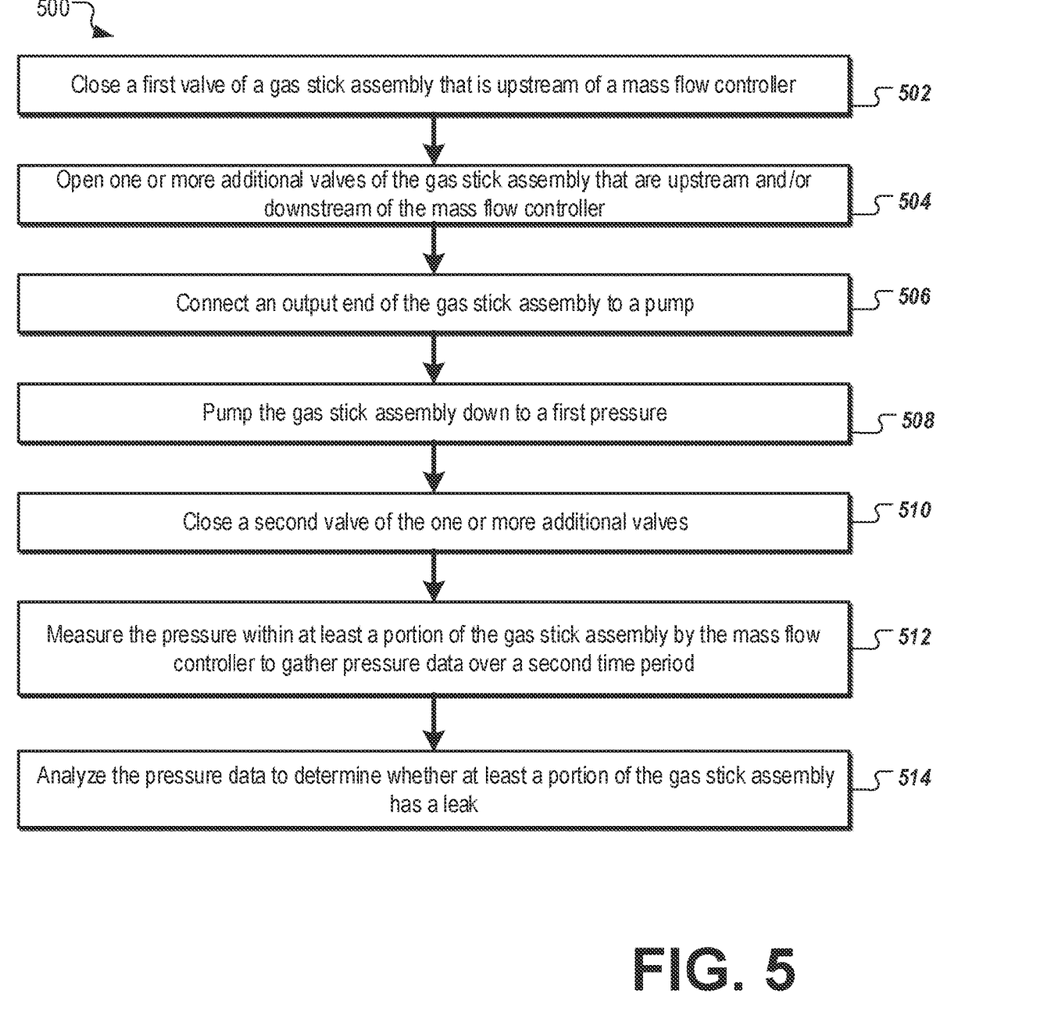
FIG. 5 illustrates a flow chart of method for detecting a gas leak according to another embodiment of the present disclosure.

FIG. 5 illustrates a flow chart of a method 500 for detecting a gas leak in a gas stick assembly according to another embodiment of the present disclosure. The method of FIG. 5 describes monitoring and/or detecting a gas leak under vacuum conditions. In a first block 502, a first valve of the gas stick assembly that is upstream of a mass flow controller (MFC) of the gas stick assembly is closed. Then, a second valve is opened that is downstream of the MFC in block 504. An output end of the gas stick assembly may then be connected to a pump 506. Alternatively, the output end may already be connected to a vacuum system in which vacuum is maintained by a pump (e.g., to a processing chamber that remains under vacuum). The gas stick assembly is then pumped down to a first pressure, wherein the first pressure is less than about 6 psia in some embodiments, such that the MFC is under vacuum conditions 508. Once vacuum conditions are reached, a second valve of the gas stick assembly is closed, such that at least a portion of the gas stick assembly between the first valve and the second valve is under vacuum after closing 510. The second valve may be a valve that is downstream of the MFC. Accordingly, the gas stick assembly between the first and second valve would be under vacuum (at least initially). The pressure is then measured using the pressure sensor in the MFC over a time period at block 512. The time period may be about 5 seconds to about 60 seconds, or about 10 seconds, about 15 seconds, about 20 seconds, about 25 seconds, about 30 seconds, about 35 seconds, about 40 seconds, about 45 seconds, about 50 seconds or about 60 seconds, or any value therein. The pressure data is then analyzed to determine whether the portion of the gas stick assembly has a leak in block 514. The pressure data may be analyzed using a processing device (e.g., a controller) to compare the data.

In embodiments, processing logic determines whether there is a leak by comparing at least a second pressure generated later in the second time period (e.g., at an end of the second time period) to a first pressure generated earlier in the second time period (e.g., at a beginning of the second time period). Based on the comparison, processing logic determines whether there is a difference between the two (or more) pressure measurements (e.g., if the second pressure is greater than the first pressure by at least a threshold amount). If there is a difference detected, then processing logic determines whether at least a portion of the gas stick assembly has a leak based on whether the detected pressure difference exceeds a pressure difference threshold. If the pressure difference exceeds the pressure difference threshold, then a leak is detected. If there is no pressure difference, or the pressure difference does not exceed the pressure difference threshold, then no leak is detected. In embodiments, the pressure difference threshold is about 5 psi to about 15 psi. Other pressure difference thresholds may also be used.

In some embodiments, pressure may be plotted over time from multiple pressure measurements to determine one or more properties of a leak, such as an extent of the leak. If a leak is detected, a signal may be sent to the system to alert a user. If there is a leak, a user can stop the processing chamber or divert the gas flow to an alternative gas stick assembly. If no leak is detected, the processing chamber can continue operating without a distribution.

As an example, the gas stick assembly of FIG. 3 may be monitored according to method 500 as follows. In a first step, the hybrid valve 301 of the gas stick assembly 300 is closed. The output end 309 is connected to a pump or area under vacuum, where the purge valve 302, and isolation valves 305 and 307 are open so that the pressure of the gas stick assembly 300 is lowered to a target pressure (e.g., less than about 6 psia). Once the target pressure is reached, the isolation valve 307 downstream of the mass flow controller 306 is closed. The pressure of the mass flow controller 306 is then measured for a time period and this pressure data is gathered in a processing device. The pressure data is then analyzed to determine whether the gas stick assembly has a leak (e.g., whether a pressure rise is observed over time).

Figure 6:
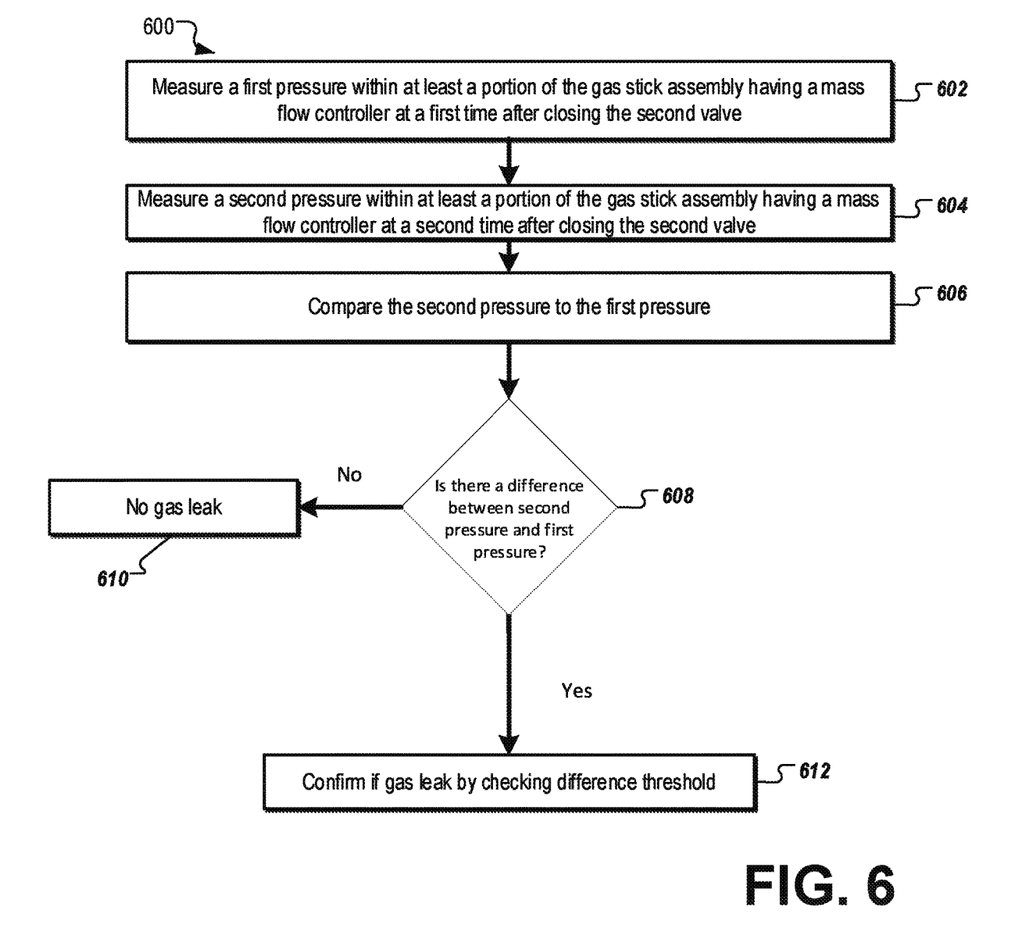
FIG. 6 illustrates a flow chart of method for measuring the pressuring in a gas stick assembly according to an embodiment of the present disclosure.

FIG. 6 illustrates a method for measuring the pressure in a gas stick assembly according to an embodiment of the present disclosure. The method for measuring the pressure 600 may be used in either the pressurized method or vacuum conditions described above. In the first block 602, a first pressure of the mass flow controller (MFC) is measured, after closing the second valve as described in FIGS. 4 and 5, at a first time using the pressure sensor of the mass flow controller. This first time may be while the gas stick assembly is being pressurized, or being brought under vacuum conditions. Thus, the first pressure may correspond to either a pressurized system or a vacuum system. In some embodiments, the first pressure may be about 30 psia to about 50 psia, or about 30 psia, about 35 psia, about 40 psia, about 45 psia, or about 50 psia, or any value therein. In another embodiment, the first pressure may be less than about 6 psia. In yet another embodiment, the first pressure may be about 3 psia to about 60 psia, about 5 psia to about 55 psia, about 10 psia to about 50 psia, about 15 psia to about 45 psia, about 20 psia to about 40 psia, about 25 psia to about 35 psia, or any value or range therein. After the pressure conditions are reached and the second valve is closed in the gas stick assembly, a second pressure measurement is taken 604. The second pressure measurement is also taken using the pressure sensor of the MFC. As described above, the MFC generates pressure measurements and sends the pressure measurements to the controller periodically or continuously over the second time period. The first and second pressure measurements are then compared 606 and analyzed by processing logic (e.g., by the controller). When comparing the data, one should check if there is a difference between the first and second pressure in 608. This may be achieved by a user monitoring the data or by a processing device.

In embodiments, processing logic determines whether there is a leak by comparing at least a second pressure generated later in the second time period (e.g., at an end of the second time period) to a first pressure generated earlier in the second time period (e.g., at a beginning of the second time period). Based on the comparison, processing logic determines whether there is a difference between the two (or more) pressure measurements (e.g., whether the second pressure is lower than the first pressure by at least a threshold amount). If there is a difference detected, then processing logic determines whether at least a portion of the gas stick assembly has a leak based on whether the detected pressure difference exceeds a pressure difference threshold. If the pressure difference exceeds the pressure difference threshold, then a leak is detected. If there is no pressure difference, or the pressure difference does not exceed the pressure difference threshold, then no leak is detected. In embodiments, the pressure difference threshold is about 5 psi to about 15 psi. Other pressure difference thresholds may also be used.

If there is no difference in the measurements, then there is no gas leak in the gas stick assembly. If there is a difference in the measurements, the difference threshold is checked to confirm if there is a gas leak. The difference threshold may be a difference of about 5 psi, about 6 psi, about 7 psi, about 8 psi, about 9 psi, about 10 psi, about 11 psi, about 12 psi, about 13 psi, about 14 psi, about 15 psi, about 16 psi, about 17 psi, about 18 psi, about 19 psi, about 20 psi, about 21 psi, about 22 psi, about 23 psi, about 24 psi, about 25 psi, about 26 psi, about 27 psi, about 28 psi, about 29 psi, about 30 psi, about 31 psi, about 32 psi, about 33 psi, about 34 psi, about 35 psi, about 36 psi, about 37 psi, about 38 psi, about 39 psi, or about 40 psi. If the difference threshold is satisfied, then there is a gas leak in the gas stick assembly.

In another embodiment of the present disclosure, a system is provided. The system may include a memory and a processing device. The processing device may operatively be coupled to the memory. The processing device is configured to cause a valve of the gas stick assembly that is either downstream or upstream of a mass flow controller of the gas stick assembly according to the present disclosure to close. The processing device is also configured to cause one or more additional valves of the gas stick assembly system to remain open for a time period until the gas stick assembly reaches a target pressure. The processing device may also cause a second valve of the one or more additional valves to close once the gas stick assembly reaches the target pressure, wherein at least a portion of the gas stick between the first valve and the second valve has the target pressure after closing the second valve. The processing device may then receive pressure data for a pressure within at least the portion of the gas stick assembly from the MFC over a second time period; and analyze the pressure data to determine whether at least the portion of the gas stick assembly has a leak. In some embodiments, the target pressure may be about 10 psia to about 50 psia, or about 10 psia, about 15 psia, about 20 psia, about 25 psia, about 30 psia, about 35 psia, about 40 psia, about 45 psia, or about 50 psia, or any value therein.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method for monitoring a gas leak in a gas stick assembly, wherein the method comprises:
    closing a first valve of the gas stick assembly that is downstream of a pressure sensor in a flow path of the gas stick assembly;

opening one or more additional valves of the gas stick assembly that are upstream of the pressure sensor for a first time period until the gas stick assembly is pressurized by a gas;

closing a second valve of the one or more valves, wherein at least a portion of the gas stick assembly between the first valve and the second valve is pressurized after closing the second valve;

measuring pressure within at least the portion of the gas stick assembly by the pressure sensor to gather pressure data over a second time period; and analyzing the pressure data to determine whether at least the portion of the gas stick assembly has a leak, wherein the gas stick assembly comprises a first end comprising an input configured to receive the gas from a gas source, a second end comprising an output configured to deliver the gas to a destination, and a plurality of components between the first end and the second end, and wherein the pressure sensor is a pressure sensor of a mass flow controller (MFC).

2. The method of claim 1, wherein:
measuring the pressure within at least the portion of the gas stick assembly comprises:
measuring a first pressure within at least the portion of the gas stick assembly using the pressure sensor at a first time after closing the second valve; and
measuring a second pressure within at least the portion of the gas stick assembly using the pressure sensor at a second time after closing the second valve; and
analyzing the pressure data comprises:
comparing the second pressure to the first pressure;
determining whether there is a difference between the second pressure and the first pressure based on the comparing; and
determining whether at least the portion of the gas stick assembly has a leak based on whether there is a difference between the second pressure and the first pressure that exceeds a difference threshold.

3. The method of claim 2, wherein the first valve is located at the output, wherein the second valve is a hybrid valve comprising a first mechanism that actuates via a first type of input and a second mechanism that actuates via a second type of input, wherein the hybrid valve is located at the input, and where at least the portion of the gas stick assembly comprises an entirety of the gas stick assembly between the input and the output.

4. The method of claim 3, wherein the first time period is about 5 seconds to about 30 seconds.

5. The method of claim 3, wherein at least the portion of the gas stick assembly is pressured to a pressure of about 3 psia to about 60 psia.

6. The method of claim 5, wherein the method is performed in-situ for a processing chamber between processes performed on product without stopping the processes.

7. The method of claim 2, wherein the difference threshold comprises about 5 psi to about 15 psi.

8. The method of claim 2, wherein the gas comprises a non-toxic gas or a toxic gas.

9. A method for monitoring a gas leak in a gas stick assembly, wherein the method comprises:
closing a first valve of the gas stick assembly that is upstream of a pressure sensor in a flow path of the gas stick assembly;
opening a second valve of one or more valves of the gas stick assembly that is downstream of the pressure sensor;
connecting an output end of the gas stick assembly to a pump;
pumping the gas stick assembly down to a first pressure;
closing the second valve of the one or more valves of the gas stick assembly, wherein at least a portion of the gas stick assembly between the first valve and the second valve is under vacuum after closing the second valve;
measuring pressure within at least the portion of the gas stick assembly by the pressure sensor to gather pressure data over a time period; and
analyzing the pressure data to determine whether at least the portion of the gas stick assembly has a leak,
wherein the gas stick assembly comprises a first end comprising an input configured to receive a gas from a gas source, a second end comprising the output end configured to deliver the gas to a destination, and a plurality of components between the first end and the second end, and wherein the pressure sensor is a pressure sensor of a mass flow controller (MFC).

10. The method of claim 9, wherein:
measuring the pressure within at least the portion of the gas stick assembly comprises:
measuring a first pressure within at least the portion of the gas stick assembly using the pressure sensor at a first time after closing the second valve; and
measuring a second pressure within at least the portion of the gas stick assembly using the pressure sensor at a second time after closing the second valve; and
analyzing the pressure data comprises:
comparing the second pressure to the first pressure;
determining whether there is a difference between the second pressure and the first pressure based on the comparing; and
determining whether at least the portion of the gas stick assembly has a leak based on whether there is a difference between the second pressure and the first pressure that exceeds a difference threshold.

11. The method of claim 10, wherein the second valve is located at the output end, wherein the first valve is a hybrid valve comprising a first mechanism that actuates via a first type of input and a second mechanism that actuates via a second type of input, wherein the hybrid valve is located at the input, and where at least the portion of the gas stick assembly comprises an entirety of the gas stick assembly between the input and the output.

12. The method of claim 11, wherein the pumping is performed for a second time period of about 5 seconds to about 30 seconds.

13. The method of claim 11, wherein the first pressure is a vacuum pressure of below about 6 psia.

14. The method of claim 13, wherein the method is performed in-situ for a processing chamber between processes performed on product.

15. The method of claim 10, wherein the difference threshold comprises about 5 psi to about 15 psi.

16. The method of claim 10, wherein the gas comprises a non-toxic gas or a toxic gas.

17. A system comprising:
a memory; and
a processing device operatively coupled to the memory, wherein the processing device is configured to:
cause a first valve of a gas stick assembly that is a first one of a downstream or upstream of a mass flow controller (MFC) of the gas stick assembly to close;
cause one or more additional valves of the gas stick assembly to remain open for a first time period until the gas stick assembly reaches a target pressure;

cause a second valve of the one or more additional valves to close once the gas stick assembly reaches the target pressure, wherein at least a portion of the gas stick assembly between the first valve and the second valve has the target pressure after closing the second valve;

receive pressure data for a pressure within at least the portion of the gas stick assembly from a pressure sensor of the MFC over a second time period, wherein the pressure sensor is in a flow path in the gas stick assembly; and analyze the pressure data to determine whether at least the portion of the gas stick assembly has a leak, wherein the gas stick assembly comprises a first end comprising an input configured to receive a gas from a gas source, a second end comprising the output end configured to deliver the gas to a destination, and a plurality of components between the first end and the second end.

18. The system of claim 17, wherein the target pressure is about 10 psia to about 50 psia.

* * * * *